United States Patent [19]

Sekiguchi

[11] Patent Number: 5,838,443
[45] Date of Patent: Nov. 17, 1998

[54] EXPOSURE APPARATUS IMPLEMENTING PRIORITY SPEED SETTING ARRANGEMENT

[75] Inventor: Hiroyuki Sekiguchi, Utsunomiya, Japan

[73] Assignee: Canon Kabushiki Kaisha, Tokyo, Japan

[21] Appl. No.: 704,248

[22] Filed: Aug. 28, 1996

[30] Foreign Application Priority Data

Aug. 29, 1995 [JP] Japan ................................. 7-242316

[51] Int. Cl.$^6$ ................................. G01B 11/00
[52] U.S. Cl. ...................... 356/363; 356/401; 355/53; 355/55
[58] Field of Search ................... 356/345, 363, 356/400, 401; 355/53, 55

[56] References Cited

U.S. PATENT DOCUMENTS 5,008,703   4/1991   Kawakami et al. ................ 356/401

*Primary Examiner*—Robert Kim
*Attorney, Agent, or Firm*—Fitzpatrick, Cella, Harper & Scinto

[57] ABSTRACT

An exposure apparatus includes an exposure system for printing a pattern of a mask on a photosensitive substrate while moving a stage, supporting the photosensitive substrate, sequentially to exposure positions in accordance with a speed pattern having a predetermined highest speed and a predetermined maximum acceleration, and a device for changeably setting the highest speed.

7 Claims, 4 Drawing Sheets

EXPOSURE APPARATUS IMPLEMENTING PRIORITY SPEED SETTING ARRANGEMENT

FIELD OF THE INVENTION AND RELATED ART

This invention relates to an exposure apparatus for manufacture of semiconductor integrated circuits and, more particularly, to an exposure apparatus having an improved wafer stage device for moving a wafer two-dimensionally along an exposure reference plane.

In a lithographic process of manufacture of semiconductor integrated circuits, step-and-repeat type reduction projection exposure apparatuses (called a "stepper") are used prevalently. FIG. 5 shows the structure of such a stepper. Denoted in the drawing at 1 is a wafer. Denoted at 2 is an X-stage of a wafer stage, and denoted at 3 is a Y stage of the wafer stage. Denoted at 4 is an X-stage driving linear motor, and denoted at 5 is a Y-stage driving linear motor. Denoted at 6 is a measurement mirror. Denoted at 7 is a laser beam for measurement of the X-stage position, and denoted at 8 is a laser beam for measurement of the Y-stage position. Denoted at 9 is a laser interferometer for measurement of the X-stage position, and denoted at 10 is a laser interferometer for measurement of the Y-stage position. Denoted at 11 is a reduction projection lens, and denoted at 12 is a reticle. Denoted at 13 is a light flux emitted from a light source such as a ultraviolet rays or X-rays.

In operation of such a semiconductor reduction exposure apparatus, a fine pattern formed on the reticle 12 is illuminated with the light 13, and the pattern is transferred and printed on the wafer 1 by the reduction projection lens 11 at a reduction ratio of 1:5, for example. In this printing process, sequential exposures are made to the wafer 1 while it is repeatedly moved in X and Y directions (step-and-repeat motion). For such X-Y motions, the linear motors 4 and 5 are actuated in accordance with the position as measured through the laser interferometers 9 and 10, by which the wafer stage (stages 2 and 3) is positioned.

FIG. 3 illustrates a process of wafer stage drive during the X-Y motion mentioned above. The axis of abscissa denotes time, and the axis of ordinate denotes speed. Characters S1, S2, S3 and S4 shows differences in speed pattern due to differences in stage movement amount. In the pattern S1 where the stage movement amount is small, the stage is accelerated at maximum acceleration and, then, maximum deceleration is executed before a highest speed V1 is reached, by which the stage is moved to a target position. On the other hand, in the pattern S4 where the stage movement amount is large, the stage is accelerated at maximum acceleration to the highest speed V1 and, after constant speed movement at this highest speed V1, maximum deceleration is executed, by which the stage is moved to its target position.

Basic performances required for steppers such as shown in FIG. 5 include registration precision and throughput. A wafer stage is a mechanism which is important in determining these performances. The positioning precision of the wafer stage largely influences the registration precision, and driving time of the wafer stage largely influences the throughput.

However, the wafer stage driving time and the wafer stage positioning precision are contradictive factors, and improving both of the driving time and the positioning precision faces many difficulties. More particularly, increasing the maximum acceleration and the highest speed of the speed pattern of a wafer stage largely contributes to reduction of driving time. However, increasing the maximum acceleration and the highest speed results in enlarged amplitude of vibration of the main structure of the stepper, that is, the base which supports the wafer stage. This directly causes an external disturbance that deteriorates the wafer stage positioning precision. Referring to FIGS. 4A and 4B, for example, comparing speed patterns p1 and p2, driving time is reduced in the speed pattern p2 by increasing the highest speed. However, as regards the amplitude of vibration of the main structure, displacement of the main structure in the case of p2 is h2 which is large as compared with displacement h1 in the case of speed pattern p1. Particularly, residual vibration after completion of drive is an external disturbance to the positioning, which causes deterioration of the positioning precision.

Thus, in conventional steppers, the maximum acceleration and the highest speed of a speed pattern of a wafer stage are selected and fixed so that a highest registration precision as required for that stepper is satisfied.

SUMMARY OF THE INVENTION

Semiconductor integrated circuit manufacturing processes include a process which does not need a highest precision of a stepper. Since, however, the maximum acceleration and the highest speed of the wafer stage are fixed as described above, the wafer stage driving time is fixed to any precision required. This is an obstacle to improvement of throughput.

It is an object of the present invention to provide an exposure apparatus which enables a highest throughput with a necessary and sufficient precision as required by individual processes of semiconductor integrated circuit manufacture.

In accordance with an aspect of the present invention, there is provided an exposure apparatus, comprising: exposure means for printing a pattern of a mask on a photosensitive substrate while moving a stage, supporting the photosensitive substrate, sequentially to exposure positions in accordance with a speed pattern having a predetermined highest speed and a predetermined maximum acceleration; and means for changeably setting the highest speed.

The exposure apparatus may further comprise means for changeably setting the maximum acceleration.

In accordance with another aspect of the present invention, there is provided an exposure apparatus, comprising: exposure means for printing a pattern of a mask on a photosensitive substrate in accordance with exposure data including information necessary for the printing, while moving a stage, supporting the photosensitive substrate, sequentially to exposure positions in accordance with a speed pattern having a predetermined highest speed and a predetermined maximum acceleration; and means for setting the highest speed and the maximum acceleration in accordance with the exposure data.

In an exposure apparatus according to the present invention, for a process in which the positioning precision between a photosensitive substrate and a mask is particularly important, a highest speed and a maximum acceleration are set at a lower level on the basis of exposure data or in accordance with an operation made by an operator, such that the exposure process is performed to achieve high positioning precision, rather than attaining high throughput. On the other hand, in a process in which the positioning precision between the photosensitive substrate and the mask is not particularly important, the maximum acceleration and the highest speed are set at a higher level on the basis of the exposure data or in accordance with an operation made by the operator, such that the exposure process is performed to achieve high throughput, rather than accomplishing high positioning precision.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Figure 1:
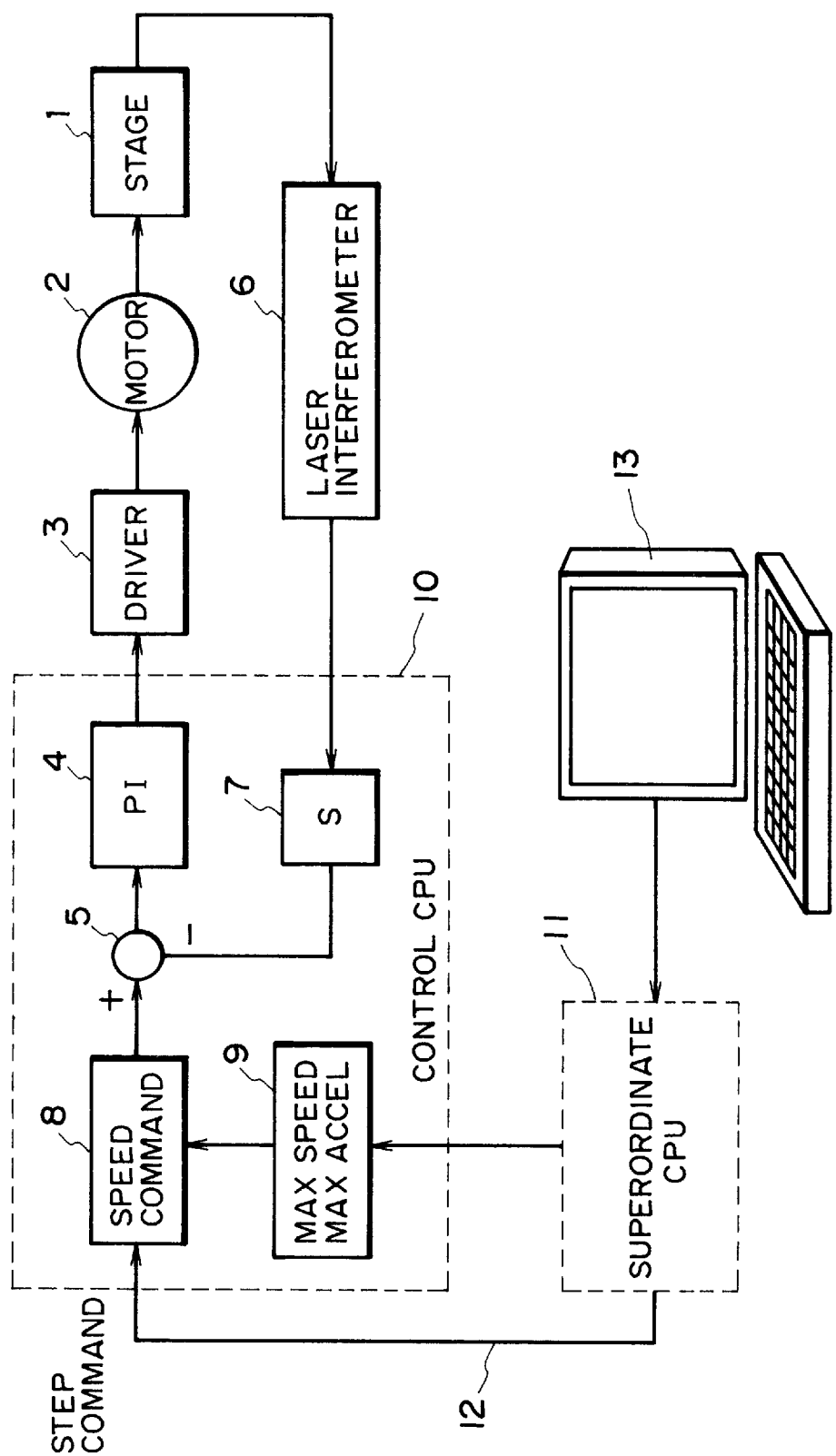
FIG. 1 is a block diagram of wafer stage speed controlling means of an exposure apparatus according to an embodiment of the present invention.

FIG. 1 is a block diagram of speed controlling means for a wafer stage of an exposure apparatus according to an embodiment of the present invention. Denoted at 1 is a wafer stage, and denoted at 2 is a motor for driving the wafer stage 1. Denoted at 3 is a driver for supplying an electric current to the motor 2, and denoted at 6 is a laser interferometer for measuring the position of the wafer stage 1. Denoted at 4 is a PI computation means, and denoted at 5 is a differential means for detecting a difference between the current position and a target position. Denoted at 7 is a differentiating means for transforming positional information of the wafer stage 1, measured through the laser interferometer 6, into speed information. Denoted at 8 is a speed designating signal producing means, and denoted at 9 is a highest speed and/or maximum acceleration register. The components denoted at 4, 5, 7, 8 and 9 are provided by a stage control CPU 10 such as a high speed microprocessor or a DSP. Denoted at 11 is a superordinate CPU for applying a command signal to the stage control CPU 10. Denoted at 13 is a console which is operated by an operator.

The position P of the wafer stage 1 is measured through the laser interferometer 6, and it is transformed by the differentiating means 7 into a speed V. The speed V is then received by the differential means 5 by which a difference S between it and a speed designating signal as produced by the speed designating signal producing means 8 is calculated. The difference S is then transformed by a compensator 4 into a signal D for the driver 3, such that the driver 3 applies an electric current I to the motor 2 in accordance with the signal D to thereby control the speed of the stage 1.

An important feature of the present invention resides in the speed designating signal producing means 8. It serves to produce a speed designating signal on the basis of the value in the highest speed and/or maximum acceleration register 9. The level of highest speed and the level of maximum acceleration can be set as desired through the console 13 by the operator. It is transmitted through the superior CPU 11 to the stage control CPU 10. In response to apply of a step start signal 12 from the superior CPU 11, the speed designating signal producing means 8 produces a speed pattern such as shown in FIG. 2, on the basis of the step distance, the highest speed and the maximum acceleration. The wafer stage 1 moves in accordance with this speed designating signal to a position near the target position and, thereafter, the positioning control is performed. After the completion of positioning is discriminated, the exposure apparatus starts its exposure process.

Figure 2A:
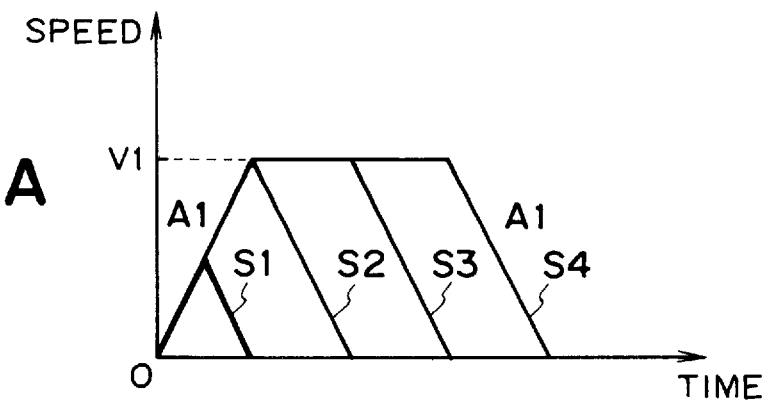
FIGS. 2A–2C are graphs for explaining speed patterns of the wafer stage of the exposure apparatus of FIG. 1.
Figure 2B:
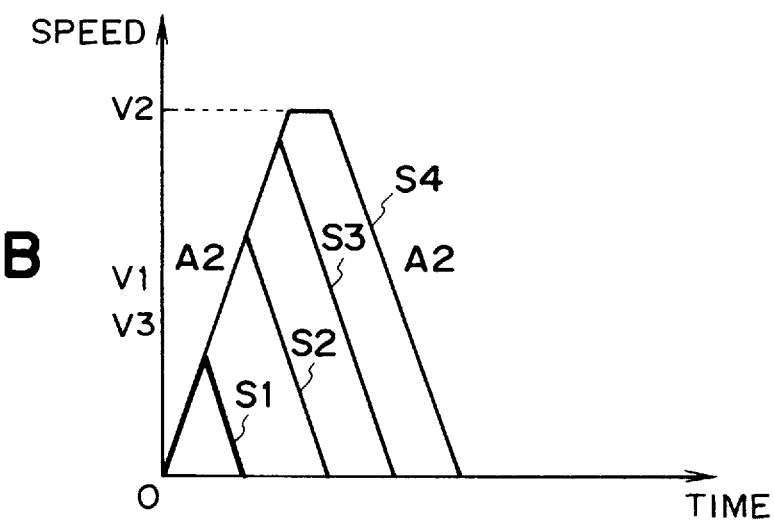

FIG. 2A illustrates a nominal speed pattern. In this case, highest speed V1=100 mm/s and maximum acceleration A1=1.0 m/s$^2$. On the other hand, for a process in which the throughput is particularly important as compared with the precision, the operator may operate the console 13 so as to set higher levels for the highest speed and maximum acceleration, e.g., a highest speed V2=200 mm/s and a maximum acceleration A2=1.5 m/s$^2$. In that occasion, a speed pattern with short driving time such as shown in FIG. 2B is produced. This enables short movement time for the wafer stage 1 and enhances the throughput.

Figure 2C:
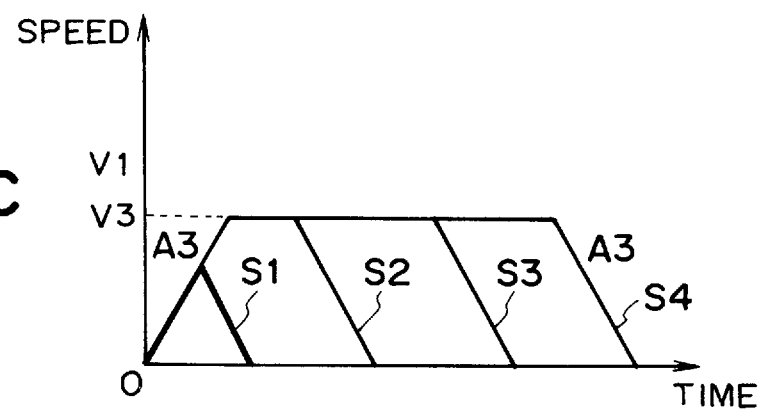
Figure 3:
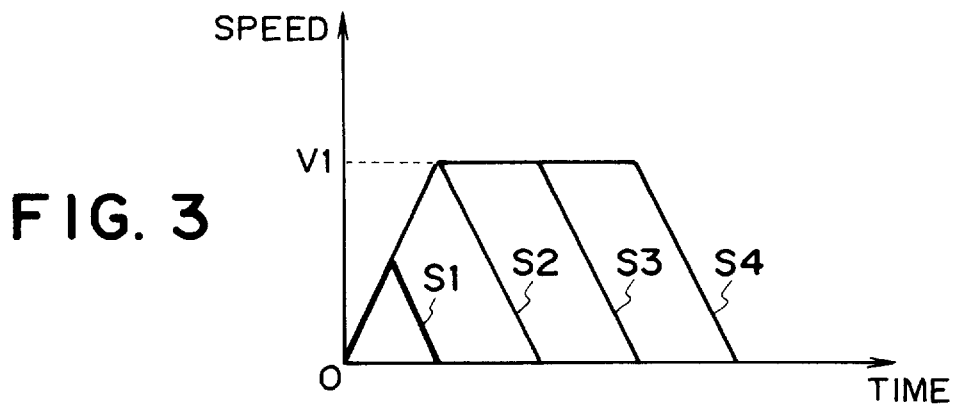
FIG. 3 is a graph for explaining a wafer stage speed pattern in conventional steppers.
Figure 4A:
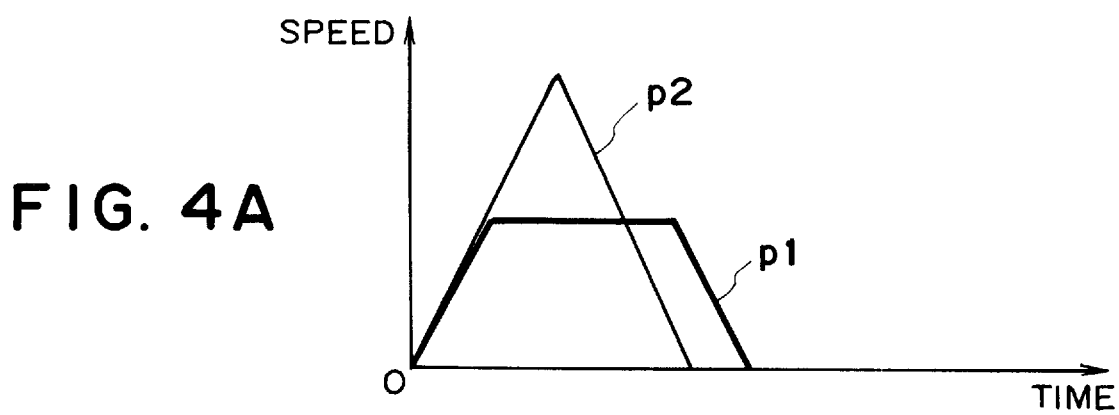
FIGS. 4A and 4B are graphs for explaining the relation between a wafer stage speed pattern and displacement of a main structure.
Figure 4B:
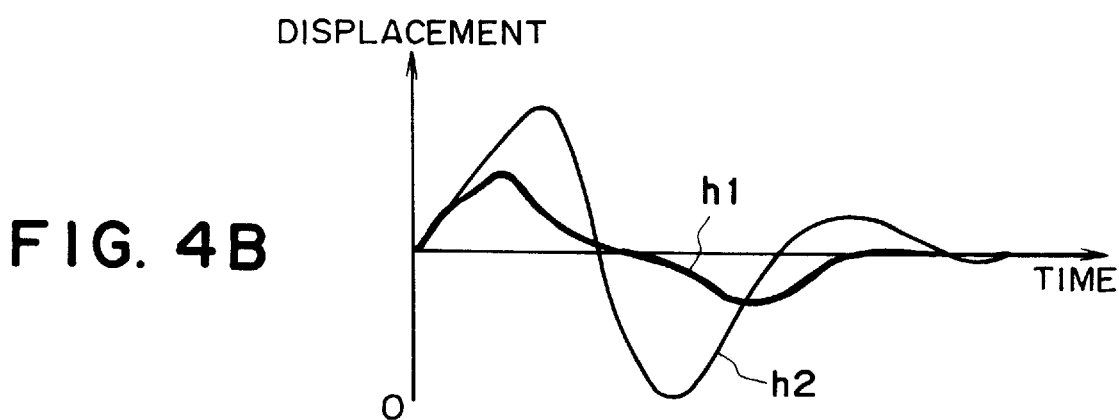
Figure 5:
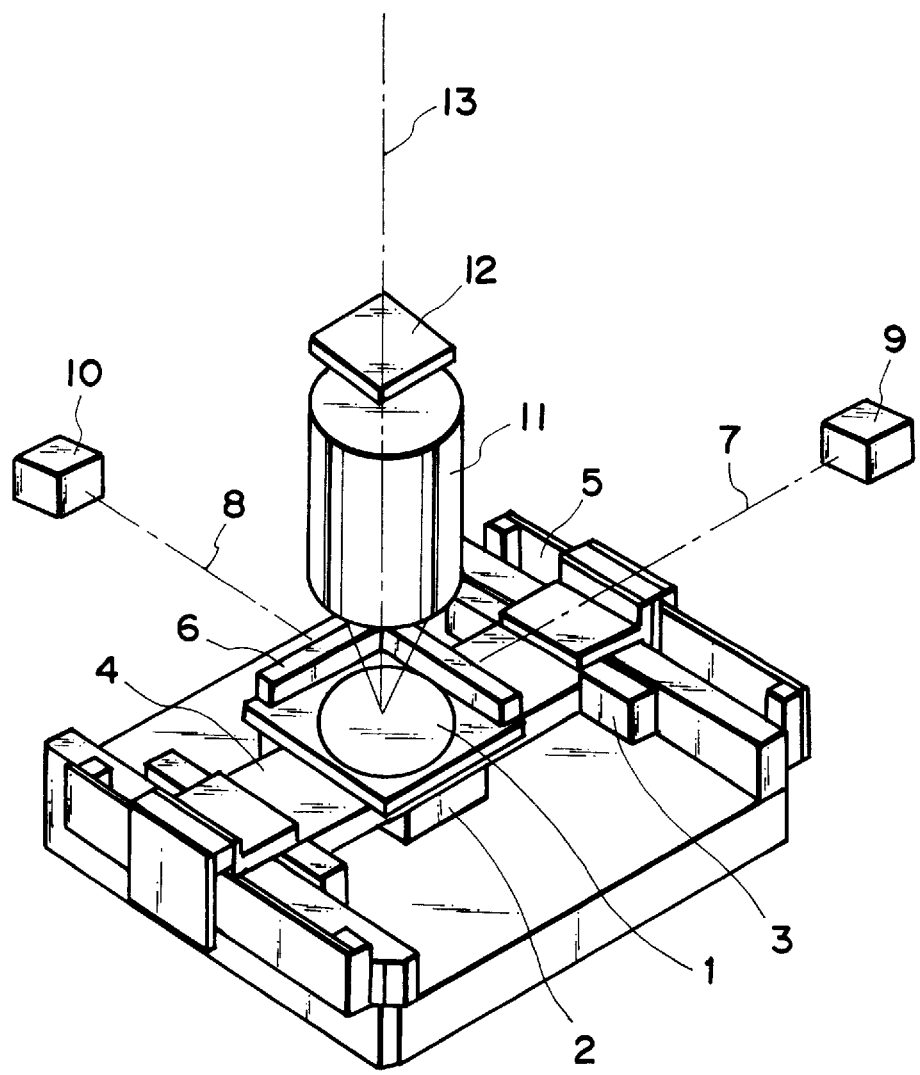
FIG. 5 is a schematic view of a stepper to which the present invention is applicable.

For a process in which the precision is particularly important as compared with the throughput, the operator may operate the console 13 so as to set lower levels, e.g., a highest speed V3=80 mm/s and a maximum acceleration A3=0.7 m/s$^2$. In that occasion, a speed pattern such as shown in FIG. 2C is produced. This enables smaller amplitude of vibration of a main structure of the stepper and provides higher positioning precision.

In the embodiment described above, the highest speed and the maximum acceleration are designated by the operator through the console 13. However, in another embodiment of the present invention, they may be determined and produced automatically on the basis of exposure data. More specifically, when an exposure process is to be performed through a stepper, the information which is necessary for the exposure process such as exposure amount and chip size, for example, is incorporated into the exposure apparatus in the form of a job file. From the required positioning precision data in that job file, the highest speed and the maximum acceleration can be determined. This may be done as follows: in response to input of a command of job file reading made by an operator for start of the operation of the apparatus, the superordinate CPU 11 automatically produces highest speed and maximum acceleration data on the basis of the required positioning precision data included in the job file, and it is transferred to the stage control CPU 10. The thus applied data may be used essentially in the same manner as in the preceding embodiment.

In accordance with the present invention as described, the highest speed and/or the maximum acceleration of a stage can be set as desired. Alternatively, they may be set automatically in accordance with exposure data. This makes it possible to set highest speed and maximum acceleration for the stage driving in accordance with precision or throughput as required to the exposure apparatus. As a result, a highest throughput within the range of a required positioning precision can be provided.

Further, a single exposure apparatus can serve as a slow-precision but high-throughput apparatus and also as a slow-throughput but high-precision apparatus. This is effective to save plant and equipment investment.

While the invention has been described with reference to the structures disclosed herein, it is not confined to the details set forth and this application is intended to cover such modifications or changes as may come within the purposes of the improvements or the scope of the following claims.

What is claimed is:

1. An exposure apparatus, comprising:

a projection optical system for projecting a pattern of an original onto a substrate;

a stage for moving the substrate;

a speed instruction generator for producing a speed instruction;

a movement controller for controlling movement of said stage in accordance with a speed instruction produced by said speed instruction generator; and speed setting means for setting a maximum speed instruction to be produced by said speed instruction generator, wherein said speed setting means is operable in association with said speed instruction generator to provide a first maximum speed instruction when alignment precision between the original and the substrate has a priority and to provide a second maximum speed instruction, different from the first maximum speed instruction, when throughput for sequential printing of the pattern of the original on different regions of the substrate has a priority.

2. An apparatus according to claim 1, further comprising a laser interferometer measuring device for measuring positional information about said stage, wherein said movement controller controls movement of said stage on the basis of a speed instruction provided by said speed instruction generator and of the positional information provided by said laser interferometer measuring device.

3. An apparatus according to claim 1, wherein said speed setting means further sets a maximum acceleration in relation to a speed instruction produced by said speed instruction generator, and wherein said speed setting means is operable in association with said speed instruction generator to provide a first maximum acceleration when the alignment precision between the original and the substrate has a priority and to provide a second maximum acceleration, different from the first maximum acceleration, when the throughput for sequential printing of the pattern of the original on different regions of the substrate has a priority.

4. An apparatus according to claim 1, wherein said speed setting means sets a maximum speed instruction to be produced by said speed instruction generator, on the basis of exposure data to be used for projection exposure of the pattern of the original to the substrate.

5. An apparatus according to claim 1, wherein said speed instruction generator and said speed setting means are provided by a stage control CPU.

6. An apparatus according to claim 1, further comprising a console to be operated by an operator, wherein said speed setting means sets a maximum speed instruction to be produced by said speed instruction generator on the basis of an input applied from said console.

7. An apparatus according to claim 1, wherein the first and second maximum speed instructions to be provided by said speed setting means and said speed instruction generator function so that a maximum speed in a case where the throughput for sequential pattern printing has a priority is larger than a maximum speed in a case wherein the alignment precision has a priority.

* * * * *

UNITED STATES PATENT AND TRADEMARK OFFICE
CERTIFICATE OF CORRECTION

PATENT NO. : 5,838,443
DATED       : November 17, 1998
INVENTOR    : HIROYUKI SEKIGUCHI It is certified that error appears in the above-identified patent and that said Letters Patent is hereby corrected as shown below:

COLUMN 1:

line 28, "as a" should read --as--; and
    line 43, "shows" should read --show--.

COLUMN 3:

line 66, "apply of" should read --application of--.

Signed and Sealed this

Thirteenth Day of July, 1999

Attest:

Q. TODD DICKINSON

*Attesting Officer*       *Acting Commissioner of Patents and Trademarks*